US012776440B2

(12) United States Patent
Higuchi et al.

(10) Patent No.: US 12,776,440 B2
(45) Date of Patent: Oct. 27, 2026

(54) ELECTRONIC CIRCUIT

(71) Applicant: Murata Manufacturing Co., Ltd., Kyoto-fu (JP)

(72) Inventors: Tarou Higuchi, Nagaokakyo (JP); Yoshihiro Imanishi, Nagaokakyo (JP); Yasushi Saito, Nagaokakyo (JP); Hiroyuki Honda, Nagaokakyo (JP); Minehito Yoshida, Nagaokakyo (JP); Akio Igarashi, Nagaokakyo (JP); Sayaka Sekiguchi, Nagaokakyo (JP); Miyuki Nojiri, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 1161 days.

(21) Appl. No.: 17/848,683

(22) Filed: Jun. 24, 2022

(65) Prior Publication Data

US 2022/0359116 A1 Nov. 10, 2022

Related U.S. Application Data

(63) Continuation of application No. PCT/JP2020/040451, filed on Oct. 28, 2020.

(30) Foreign Application Priority Data

Dec. 27, 2019 (JP) ................................ 2019-238218

(51) Int. Cl.
*H01F 27/36* (2006.01)
*H01F 17/04* (2006.01)
(Continued)

(52) U.S. Cl.
CPC ............. *H01F 27/36* (2013.01); *H01F 17/04* (2013.01); *H01F 27/2823* (2013.01); *H03H 7/1741* (2013.01); *H01F 2017/0093* (2013.01)

(58) Field of Classification Search
CPC ........................................................ H01F 27/36
(Continued)

(56) References Cited

U.S. PATENT DOCUMENTS 4,682,125 A 7/1987 Harrison et al.
2010/0253454 A1 10/2010 Schilling et al.

FOREIGN PATENT DOCUMENTS

JP H09-260885 A 10/1997
JP 2003-338722 A 11/2003
(Continued)

OTHER PUBLICATIONS

International Search Report issued in PCT/JP2020/040451; mailed Dec. 1, 2020.

*Primary Examiner* — Ronald Hinson
(74) *Attorney, Agent, or Firm* — Studebaker Brackett PLLC

(57) ABSTRACT

An electronic circuit includes a shield line including first and second signal lines and a shield. The first and second signal lines are connected to a signal source, and the shield coating is around the first and second signal lines. The electronic circuit further includes a signal ground near the signal source; a frame ground that is isolated from the signal ground and connected to the shield; a common mode choke coil that includes first, second and third coils magnetically coupled to one another; and a capacitor that is connected in parallel with the third coil. The first coil is connected in series between the signal source and the first signal line. The second coil is connected in series between the signal source and the second signal line. The third coil and the capacitor that are connected in parallel are connected between the signal ground and the frame ground.

16 Claims, 5 Drawing Sheets

(51) Int. Cl.
*H01F 27/28* (2006.01)
*H03H 7/01* (2006.01)
*H01F 17/00* (2006.01)

(58) Field of Classification Search
USPC .......................................................... 336/221
See application file for complete search history.

(56) References Cited

FOREIGN PATENT DOCUMENTS

| | | | |
|---|---|---|---|
| JP | 2005-318539 | A | 11/2005 |
| JP | 2010-135602 | A | 6/2010 |
| JP | 2017-063290 | A | 3/2017 |
| WO | 2011/004453 | A1 | 1/2011 |
| WO | 2016/063520 | A1 | 4/2016 |

ELECTRONIC CIRCUIT

CROSS-REFERENCE TO RELATED APPLICATIONS

This application claims benefit of priority to International Patent Application No. PCT/JP2020/040451, filed Oct. 28, 2020, and to Japanese Patent Application No. 2019-238218, filed Dec. 27, 2019, the entire contents of each are incorporated herein by reference.

BACKGROUND

Technical Field

The present disclosure relates to electronic circuits.

Background Art

A differential transmission technique for performing communication between devices is used in in-vehicle devices mounted on vehicles or the like. In Japanese Unexamined Patent Application Publication No. 2005-318539, a differential transmission circuit that includes a shield line including a pair of signal lines and a shield coating the pair of signal lines is described. In the differential transmission circuit in Japanese Unexamined Patent Application Publication No. 2005-318539, a common mode choke coil is provided between a substrate ground and the shield line.

In an in-vehicle device, a signal ground provided near a signal source and a frame ground connected to a shield may be arranged isolated from each other. Thus, damage can be prevented from occurring to an electronic circuit when external noise such as ESD is applied.

SUMMARY

However, in the case where the signal ground and the frame ground are isolated from each other, a loop formed by a path for signal transmission and the grounds is large, and common mode noise is thus likely to be generated. Furthermore, in the case where the common mode choke coil including three lines described in Japanese Unexamined Patent Application Publication No. 2005-318539 is used, in order to obtain a necessary inductance, the size of components needs to be increased, and size reduction may be difficult.

Accordingly, the present disclosure provides an electronic circuit capable of achieving size reduction and effectively reducing noise.

An electronic circuit according to an aspect of the present disclosure includes a shield line that includes a first signal line, a second signal line, and a shield. The first signal line and the second signal line are connected to a signal source, and the shield coating is around the first signal line and the second signal line. The electronic circuit further includes a signal ground that is provided near the signal source; a frame ground that is isolated from the signal ground and is connected to the shield; a common mode choke coil that includes a first coil, a second coil, and a third coil magnetically coupled to one another; and a capacitor that is connected in parallel with the third coil. The first coil is connected in series between the signal source and the first signal line. The second coil is connected in series between the signal source and the second signal line. The third coil and the capacitor that are connected in parallel are connected between the signal ground and the frame ground.

With an electronic circuit according to the present disclosure, size reduction can be achieved, and noise can be effectively reduced.

DETAILED DESCRIPTION

Hereinafter, electronic circuits according to embodiments of the present disclosure will be described in detail with reference to drawings. The present disclosure is not intended to be limited to the embodiments described below. It is obvious that the embodiments described below are merely examples and configurations illustrated in different embodiments may be partially replaced or combined. In a second embodiment and later embodiments, details common to the first embodiment will not be described and only differences will be described. In particular, similar operational effects achieved by similar configurations will not be repeatedly mentioned in each of the embodiments.

Figure 1:
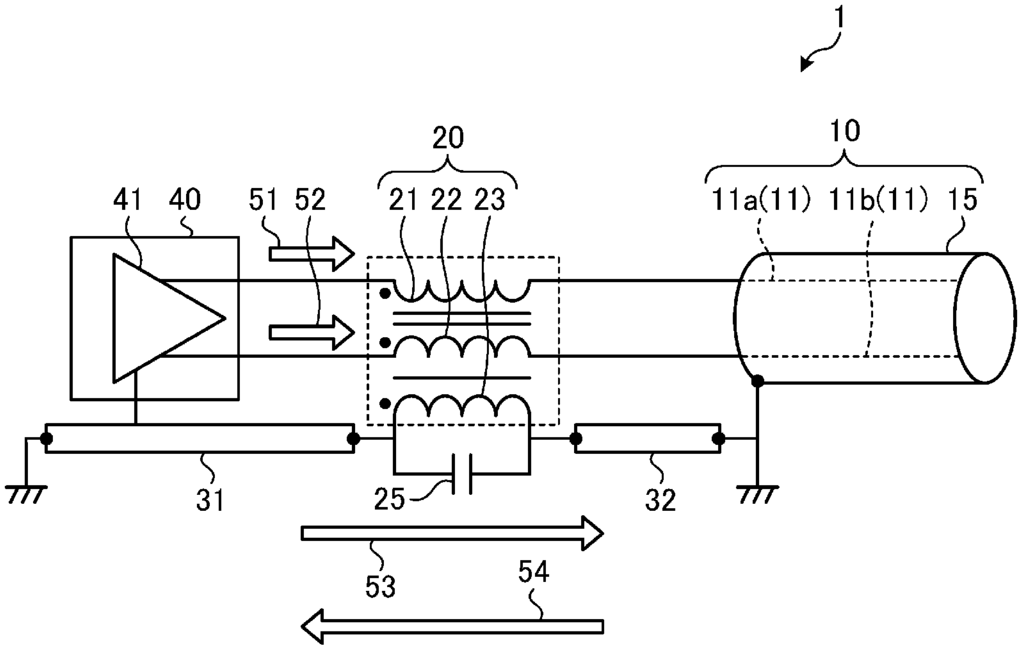
FIG. 1 is a schematic diagram illustrating a configuration of an electronic circuit according to an embodiment.

FIG. 1 is a schematic diagram illustrating a configuration of an electronic circuit according to an embodiment. As illustrated in FIG. 1, an electronic circuit 1 includes a shield line 10, a common mode choke coil 20, a capacitor 25, a signal ground 31, a frame ground 32, and an IC (Integrated Circuit) 40.

The shield line 10 includes a pair of first signal line 11*a* and second signal line 11*b* and a shield 15, which can be a coating, positioned around the pair of first signal line 111*a* and second signal line 11*b*. The shield line 10 transfers signals to and from an external electronic device. The electronic circuit 1 uses a differential transmission method. Signals of different phases are transmitted through the pair of first signal line 11*a* and second signal line 11*b*. Furthermore, the pair of first signal line 11*a* and second signal line 11*b* are formed as, for example, a twisted pair line. Thus, the shield line 10 can reduce emission of noise. In the explanation provided below, when there is no need to distinguish between the first signal line 11*a* and the second signal line 11*b*, the first signal line 11*a* and the second signal line 11*b* may be simply referred to as signal lines 11.

The common mode choke coil 20 includes a first coil 21, a second coil 22, and a third coil 23 that are magnetically coupled to one another. That is, the first coil 21 and the second coil 22 are magnetically coupled, the second coil 22 and the third coil 23 are magnetically coupled, and the first coil 21 and the third coil 23 are magnetically coupled. It is desirable that coupling coefficients between the coils be the same. However, coupling coefficients between the coils may be different. The single common mode choke coil 20 is provided for the single shield line 10.

The capacitor 25 is connected in parallel with the third coil 23. Specifically, one end of the capacitor 25 and one end of the third coil 23 are connected, and the other end of the capacitor 25 and the other end of the third coil 23 are connected. For example, a capacitor element such as a chip capacitor may be used as the capacitor 25. The capacitor 25 is a component integrated with the first coil 21, the second coil 22, and the third coil 23. In this embodiment, "integration" represents a case where a component element of the common mode choke coil 20 and a component element of the capacitor 25 are directly in contact with each other or a case where part of a component element of the common mode choke coil 20 and part of a component element of the capacitor 25 are in common.

The signal ground 31 is provided near a signal source 41, that is, provided at a position closer to the signal source 41 than the frame ground 32 is. The signal ground 31 is connected to a reference potential for a signal transmitted through the signal lines 11. The frame ground 32 is provided isolated from the signal ground 31 and is connected to the shield 15 of the shield line 10. The frame ground 32 is connected near a connector to which the shield line 10 is connected and is also referred to as a connector ground. Furthermore, the frame ground 32 is connected to a frame potential for an electronic device on which the electronic circuit 1 is mounted.

The IC 40 includes the signal source 41 that is provided for each shield line 10. The signal source 41 is electrically connected to the pair of signal lines 11 with the common mode choke coil 20 interposed therebetween and supplies a differential signal to the pair of signal lines 11. Furthermore, the IC 40 is connected to the signal ground 31. In FIG. 1, an example of the IC 40 that includes the single signal source 41 is illustrated. However, the IC 40 is not limited to this configuration. In the case where the electronic circuit 1 includes a plurality of shield lines 10, the IC 40 may include a plurality of signal sources 41 in association with the plurality of shield lines 10.

In the common mode choke coil 20, the first coil 21 is connected in series between the signal source 41 and the first signal line 11*a*. The second coil 22 is connected in series between the signal source 41 and the second signal line 11*b*. The third coil 23 and the capacitor 25, which are connected in parallel, are connected between the signal ground 31 and the frame ground 32.

In other words, one end of the first coil 21 is connected to the signal source 41, and the other end of the first coil 21 is connected to the first signal line 11*a*. One end of the second coil 22 is connected to the signal source 41, and the other end of the second coil 22 is connected to the second signal line 11*b*. One end of the third coil 23 and one end of the capacitor 25 are connected to the signal ground 31, and the other end of the third coil 23 and the other end of the capacitor 25 are connected to the frame ground 32.

In the case where differential signals are supplied from the signal source 41 to the first coil 21 and the second coil 22, a magnetic field generated at the first coil 21 and a magnetic field generated at the second coil 22 cancel each other out. Thus, the common mode choke coil 20 has a low impedance and does not function as a filter. Therefore, the differential signals are transmitted from the signal source 41 through the first coil 21 and the second coil 22 to the first signal line 11*a* and the second signal line 11*b*.

The signal ground 31 and the frame ground 32 are connected with an LC filter including the third coil 23 and the capacitor 25 interposed therebetween. Thus, a return path for a signal is formed by the frame ground 32, the LC filter, and the signal ground 31. That is, a return current flows through in the order of the frame ground 32, the LC filter, and the signal ground 31 in a direction indicated by an arrow 54.

As described above, the electronic circuit 1 can secure a return path for a signal. That is, even with the configuration in which the signal ground 31 and the frame ground 32 are isolated from each other, a path starting from the signal source 41, through the pair of signal lines 11, the frame ground 32, and the LC filter, and returning to the signal ground 31 can be shortened. Furthermore, as described later, the LC filter has excellent transmission characteristics in a GHz band. Thus, compared to the configuration in which the capacitor 25 is not provided, a return path for a signal in a GHz band can be secured. As a result, generation of common mode noise can be reduced.

Furthermore, when common mode currents of the same direction flow through the first coil 21, the second coil 22, and the third coil 23, as indicated by arrows 51, 52, and 53, magnetic fields are generated at the first coil 21, the second coil 22, and the third coil 23. The magnetic fields generated at the first coil 21, the second coil 22, and the third coil 23 enhance one another. The common mode choke coil 20 exhibits a high impedance and functions as a filter. Thus, transmission of common mode noise from the signal ground 31 to the shield line 10 can be reduced. As a result, the electronic circuit 1 can reduce emission of noise caused by common mode noise.

Figure 2:
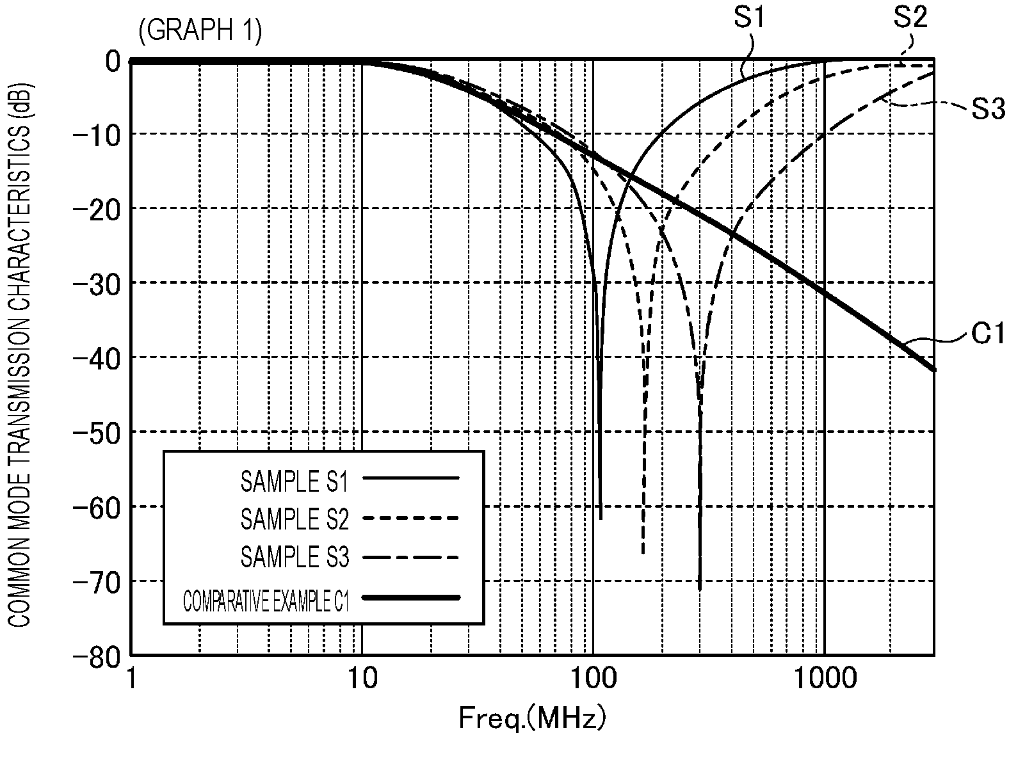
FIG. 2 is a graph illustrating the relationship between common mode transmission characteristics and frequency for each of different C values in an electronic circuit according to an embodiment.

Next, simulation results of transmission characteristics obtained when an inductance value L and a capacitance value C in the electronic circuit 1 are varied will be described. FIG. 2 is a graph illustrating the relationship between common mode transmission characteristics and frequency for each of different C values in an electronic circuit according to an embodiment. Graph 1 in FIG. 2 indicates transmission characteristics of common mode noise in the directions indicated by the arrows 51, 52, and 53 in FIG. 1. In each of the simulations described below, a coupling coefficient k between coils is set to 0.99.

In samples S1, S2, and S3 illustrated in FIG. 2, the inductance values L of all the first coil 21, the second coil 22, and the third coil 23 are 0.3 μH. The capacitance value C of the capacitor 25 in the sample S1 is 7 pF. The capacitance value C of the capacitor 25 in the sample S2 is 3 pF. The capacitance value C of the capacitor 25 in the sample S3 is 1 pF. C1 in the comparative example represents a circuit that does include a common mode choke coil including three coils (L=0.3 μH) that are magnetically connected but does not include the capacitor 25. The coupling coefficient k in the comparative example C1 is set to 0.99.

As illustrated in FIG. 2, the samples S1, S2, and S3 each have an LC resonant frequency within a range between 100 MHz and 300 MHz, both inclusive. The LC resonant frequency increases as the capacitance value C of each of the samples S1, S2, and S3 decreases. The samples S1, S2, and S3 exhibit sharp attenuation characteristics near corresponding LC resonant frequencies. That is, the samples S1, S2, and S3 have excellent noise reduction effects that common mode noise is not transmitted near the corresponding LC resonant frequencies. In contrast, the comparative example C1 exhibits moderate attenuation characteristics in a frequency range of 10 MHz or more and achieves an excellent noise reduction effect at a frequency of 400 MHz or more.

In a so-called immunity test for applying external noise to the shield line 10 to investigate malfunction of a device, a noise reduction effect such as 1 MHz or more and 400 MHz or less is required in a relatively low frequency region. As illustrated in FIG. 2, compared to the comparative example C1, the samples S1, S2, and S3 achieve an excellent noise reduction effect in a relatively low frequency region of 400 MHz or less.

As described above, by varying the capacitance value of the capacitor 25 that is provided in parallel with the third coil 23, the electronic circuit 1 can effectively achieve a noise reduction effect in accordance with the frequency of common mode noise.

Figure 3:
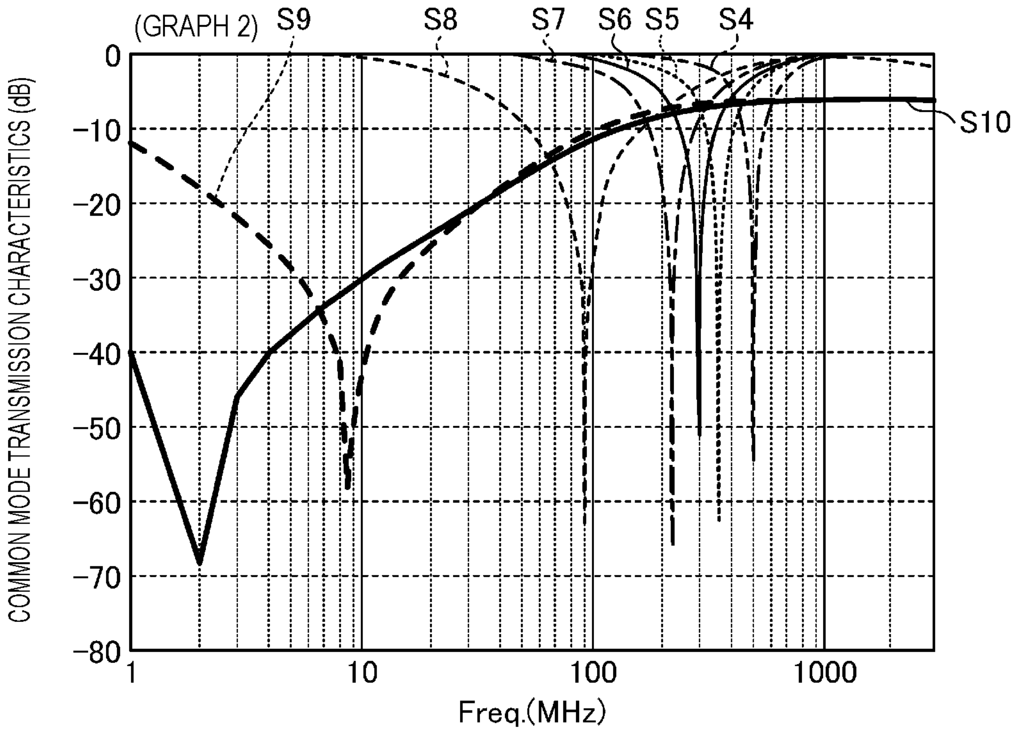
FIG. 3 is a graph illustrating the relationship between common mode transmission characteristics and frequency for each of different L values in an electronic circuit according to an embodiment.

Although the case where the capacitance value C is varied while the inductance value L is fixed is illustrated in Graph 1 of FIG. 2, the capacitance value C is not necessarily varied and the inductance value L is not necessarily fixed. FIG. 3 is a graph illustrating the relationship between common mode transmission characteristics and frequency for each of different L values in an electronic circuit according to an embodiment. In all samples S4 to S10 illustrated in Graph 2 of FIG. 3, the capacitance value C of the capacitor 25 is fixed at 10 pF.

Furthermore, the inductance value L of each coil in the sample S4 is 0.01 μH. The inductance value L of each coil in the sample S5 is 0.02 μH. The inductance value L of each coil in the sample S6 is 0.03 μH. The inductance value L of each coil in the sample S7 is 0.05 μH. The inductance value L of each coil in the sample S8 is 0.3 μH. The inductance value L of each coil in the sample S9 is 30 μH. The inductance value L of each coil in the sample S10 is 300 μH.

As illustrated in FIG. 3, in each of the samples S4 to S10, the LC resonant frequency increases as the inductance value L decreases. The samples S4 to S10 have LC resonant frequencies within a frequency range of 500 MHz or less and exhibit sharp attenuation characteristics near the corresponding LC resonant frequencies.

Figure 4:
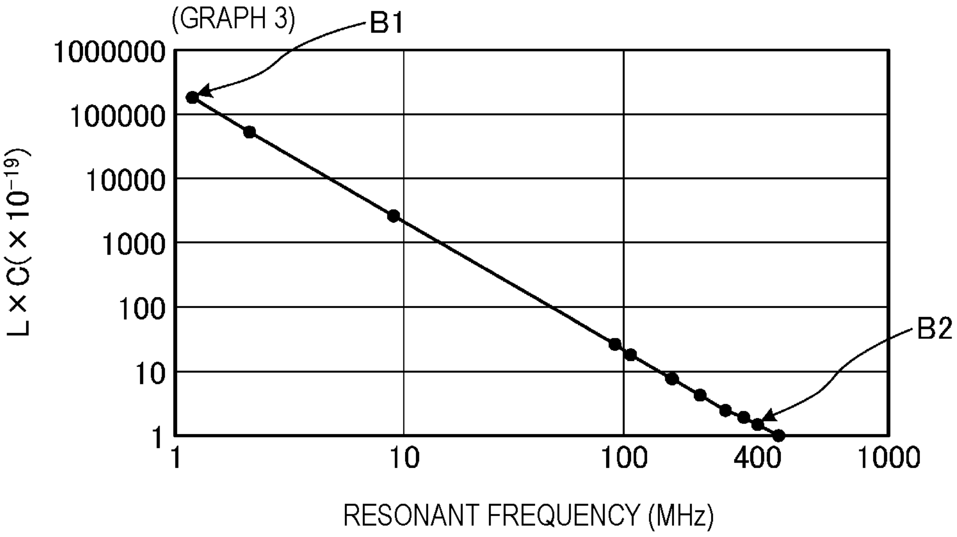
FIG. 4 is a graph illustrating the relationship between an L×C value and resonant frequency.

FIG. 4 is a graph illustrating the relationship between an L×C value and resonant frequency. The L×C value illustrated in FIG. 4 represents the product of the inductance value L and the capacitance value C. As illustrated in Graph 3 of FIG. 4, the resonant frequency tends to increase as the L×C value decreases. To achieve a noise reduction effect within a range between 1 MHz and 400 MHz, both inclusive, which is required in an immunity test, the L×C value needs to be set within a range from a point B1 to a point B2 illustrated in FIG. 4. That is, the L×C value needs to satisfy a condition indicated by Equation (1).

$$1.6\times10^{-19}\leq L\times C\leq2.5\times10^{-14} \quad (1)$$

However, in order to vary the inductance value L, the number of windings needs to be varied or the size of a core needs to be varied. Thus, due to restrictions regarding the size of the device, the arrangement of the common mode choke coil 20, and the like, it may be difficult to easily vary the inductance value L. Furthermore, in order to increase the inductance value L, the number of windings needs to be increased or the size of the core needs to be increased. Thus, it may be difficult to reduce the size of the device.

In this embodiment, as described above, the LC resonant frequency exhibiting attenuation characteristics can be varied by varying the L×C value. Thus, even in the case where the inductance value L is fixed or the inductance value L can be varied within a small range, an appropriate LC resonant frequency can be set by varying the capacitance value C. Therefore, the size of the electronic circuit 1 can be reduced, and common mode noise at a desired frequency can be reduced effectively.

Figure 5:
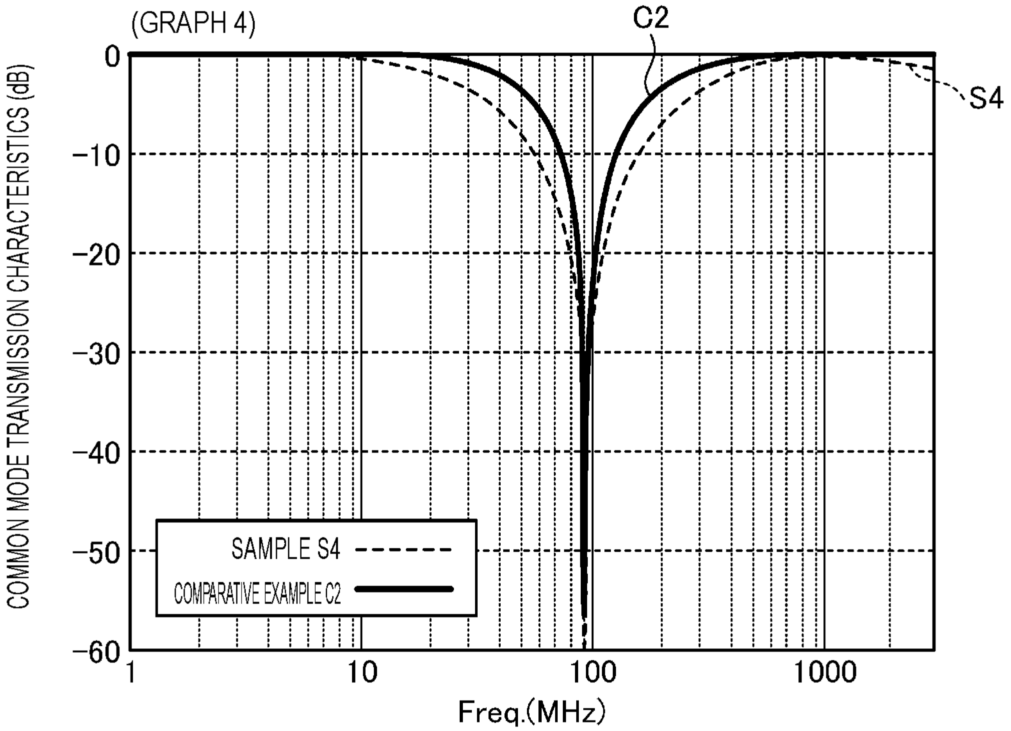
FIG. 5 is a graph illustrating the relationship between common mode transmission characteristics and frequency in each of an electronic circuit according to an embodiment and an electronic circuit according to a comparative example.

FIG. 5 is a graph illustrating the relationship between common mode transmission characteristics and frequency in each of an electronic circuit according to an embodiment and an electronic circuit according to a comparative example. In the sample S4 illustrated in Graph 4 of FIG. 5, the capacitance value C of the capacitor 25 is 10 pF and the inductance value L of each coil is 0.01 μH, as in the sample S4 illustrated in Graph 2 of FIG. 3. In a comparative example C2, the capacitance value C of the capacitor 25 is 10 pF and the inductance value L of each coil is 0.01 μH.

However, while the first coil 21, the second coil 22, and the third coil 23 are magnetically coupled in the sample S4, the comparative example C2 is configured differently such that the third coil 23 is not magnetically coupled to the first coil 21 and the second coil 22. Specifically, for example, in the sample S4, the first coil 21, the second coil 22, and the third coil 23 are magnetically coupled in such a manner that winding is applied to a common core or a core formed in an integrated manner. In the comparative example C2, the third coil 23 and the capacitor 25 are provided separated from the common mode choke coil 20.

As illustrated in FIG. 5, although the LC resonant frequency of the sample S4 is the same as the LC resonant frequency of the comparative example C2, the sample S4 achieves a noise reduction effect over a wide range compared to the comparative example C2. Specifically, while the sample S4 exhibits attenuation characteristics of −10 dB or less in a frequency band of 50 MHz or more, the comparative example C2 exhibits attenuation characteristics of −10 dB or less in a frequency band of 70 MHz or more. As is clear from the above, since the first coil 21, the second coil 22, and the third coil 23 are magnetically coupled in the sample S4, the sample S4 achieves an excellent noise reduction effect, compared to a circuit in which the common mode choke coil 20 and the LC filter are simply combined with each other.

Figure 6:
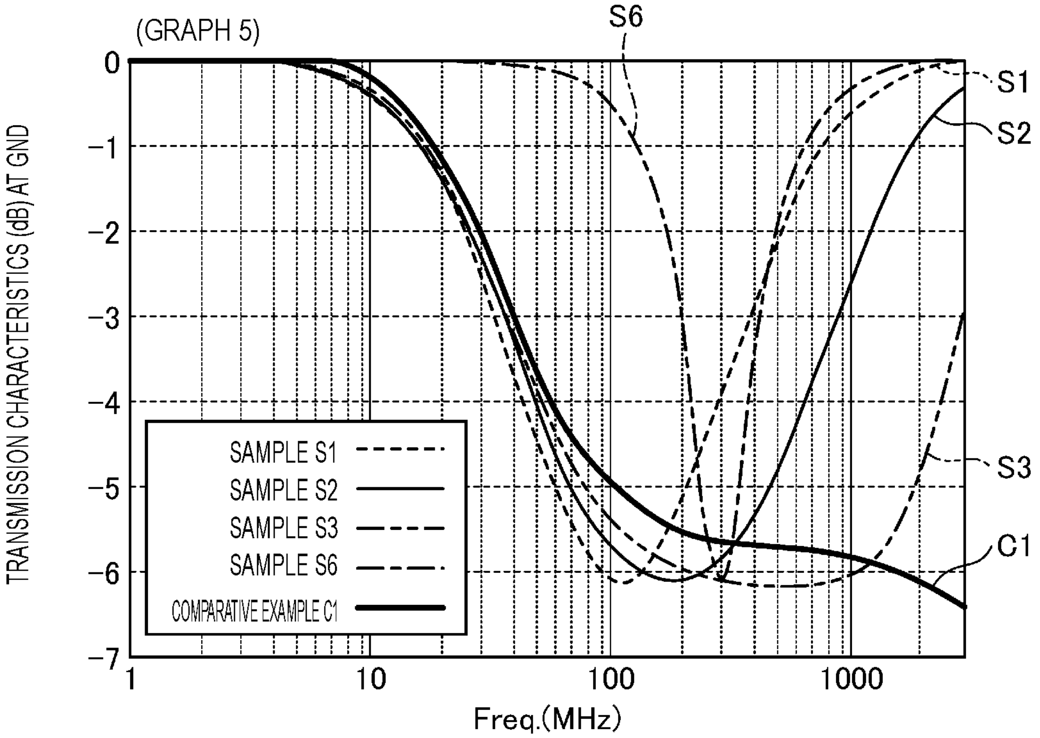
FIG. 6 is a graph illustrating the relationship between transmission characteristics at GND and frequency for each of different C values in an electronic circuit according to an embodiment.

Next, simulation results regarding transmission characteristics of a return path for a signal including the frame ground 32, the LC filter, and the signal ground 31 will be described. FIG. 6 is a graph illustrating the relationship between transmission characteristics at GND and frequency for each of different C values in an electronic circuit according to an embodiment.

The inductance values L and the capacitance values C of the samples S1, S2, S3, and S6 and the comparative example C1 illustrated in Graph 5 of FIG. 6 are similar to those illustrated in FIGS. 2 and 3 described above. Furthermore, the transmission characteristics at GND indicated on the vertical axis of Graph 5 of FIG. 6 represent transmission characteristics of a signal in a part from the frame ground 32 to the signal ground 31 illustrated in FIG. 1. In other words, the vertical axis of Graph 5 represents transmission characteristics (S21) of an LC filter including the third coil 23 and the capacitor 25. The electronic circuit 1 is mounted in a high-speed communication line of a GHz band. Thus, the LC filter needs to have excellent transmission characteristics in the GHz band.

As illustrated in FIG. 6, at a frequency of 1 GHz (1000 MHz), the transmission characteristics increase as the capacitance value C increases. That is, at a frequency of 1 GHz (1000 MHz), the sample S3 (C=1 pF) and the comparative example C1 (capacitor 25 is not provided) exhibit transmission characteristics of approximately −6 dB. The sample S2 (C=3 pF) exhibits transmission characteristics of −3 dB or more. The sample S1 (C=7 pF) and the sample S6 (C=10 pF) exhibit transmission characteristics of −1 dB or more.

For example, transmission characteristics of −3 dB or more are required for a GHz band. That is, it is desirable that the capacitance value C be 3 pF or more. As is clear from the above, with the capacitance value C of 3 pF or more, the electronic circuit 1 can secure a return path for a signal. Although the sample S3 exhibits transmission characteristics similar to those of the comparative example C1 at a frequency of 1 GHz, the sample S3 achieves excellent transmission characteristics at a frequency of 1 GHz or more compared to the comparative example C1.

Figure 7:
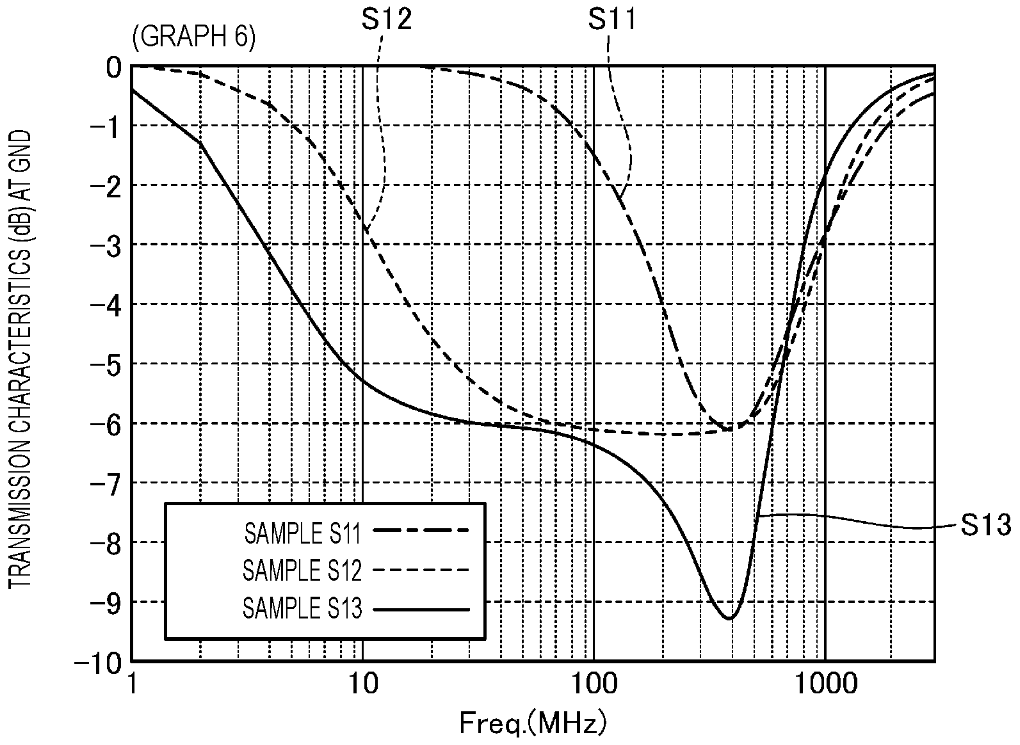
FIG. 7 is a graph illustrating the relationship between transmission characteristics at GND and frequency for each of different L values in an electronic circuit according to an embodiment.

FIG. 7 is a graph illustrating the relationship between transmission characteristics at GND and frequency for each of different L values in an electronic circuit according to an embodiment. In Graph 6 of FIG. 7, transmission characteristics obtained when the capacitance value C of an LC filter is fixed and the inductance value L is varied are illustrated.

Specifically, in all samples S11, S12, and S13 illustrated in FIG. 7, the capacitance value C of the capacitor 25 is fixed at 3 pF. Furthermore, the inductance value L of each coil in the sample S11 is 0.06 μH. The inductance value L of each coil in the sample S12 is 1 μH. The inductance value L of each coil in the sample S13 is 3 μH.

As illustrated in FIG. 7, even when the inductance value L is varied, transmission characteristics of −3 dB or more can be obtained at a frequency of 1 GHz or more. That is, as is clear from the above, in the electronic circuit 1, with the capacitance value C of 3 pF or more, a return path for a signal can be secured even when the inductance value L is varied. Based on the results mentioned above, the inductance value L and the capacitance value C in this embodiment need to satisfy Condition (1) mentioned above and Condition (2) mentioned below.

$$C \geq 3\text{ pF} \tag{2}$$

Figure 8:
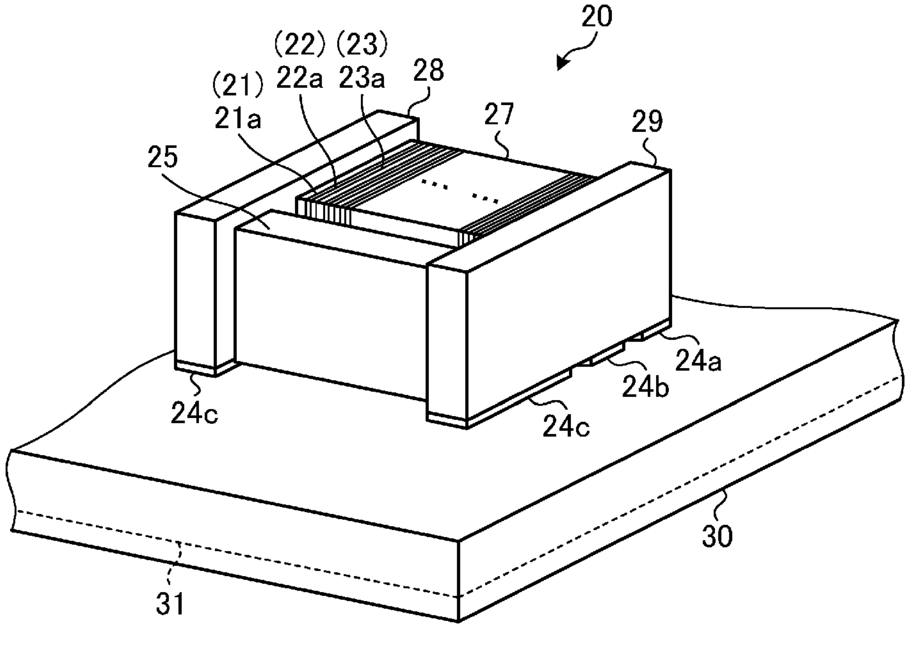
FIG. 8 is a perspective view illustrating an example of a configuration of a common mode choke coil according to an embodiment.

FIG. 8 is a perspective view illustrating an example of a configuration of a common mode choke coil according to an embodiment. As illustrated in FIG. 8, the common mode choke coil 20 is mounted on a substrate 30. The substrate 30 is a plate-like insulating substrate and is, for example, a printed substrate made of glass epoxy or the like, a ceramics substrate such as an alumina substrate, or a flexible substrate made of polyimide or the like. The signal ground 31 is provided on the substrate 30. The signal ground 31 is formed as a conductive layer provided inside the substrate 30. Although not illustrated in FIG. 8, the IC 40 (see FIG. 1), a connector (receptacle connector) connected to the shield line 10, and the like are mounted on the substrate 30.

The common mode choke coil 20 includes a core part 27, a pair of flange parts 28 and 29, and a plurality of wires 21*a*, 22*a*, and 23*a*. The core part 27 and the pair of flange parts 28 and 29 are, for example, ferrite cores. The core part 27 is a column-shaped member extending in a direction parallel to a surface of the substrate 30. The pair of flange parts 28 and 29 are provided at ends of the core part 27 in a direction in which the core part 27 extends. The pair of flange parts 28 and 29 are formed integrated with the core part 27 and made of the same material as that of the core part 27. However, the pair of flange parts 28 and 29 may be formed separated from the core part 27 and made of a material different from that of the core part 27.

The three wires 21*a*, 22*a*, and 23*a* are wound around the core part 27, and the first coil 21, the second coil 22, and the third coil 23 are thus formed, respectively. The winding directions of the three wires 21*a*, 22*a*, and 23*a* are the same. That is, when currents of the same phase flow in the three wires 21*a*, 22*a*, and 23*a*, magnetic fields are generated at the core part 27 such that the magnetic fields enhance one another. When currents of different phases flow in the three wires 21*a*, 22*a*, and 23*a*, magnetic fields are generated at the core part 27 such that the magnetic fields cancel one another out.

A first outer electrode 24*a*, a second outer electrode 24*b*, and a third outer electrode 24*c* are provided on a bottom face of the flange part 29. In a similar manner, a first outer electrode 24*a*, a second outer electrode 24*b*, and a third outer electrode 24*c* are provided on a bottom face of the flange part 28 (in FIG. 8, the first outer electrode 24*a* and the second outer electrode 24*b* of the flange part 28 are not illustrated). That is, the pair of first outer electrodes 24*a*, the pair of second outer electrodes 24*b*, and the pair of third outer electrodes 24*c* are provided. One end of the wire 21*a* (first coil 21) is connected to the first outer electrode 24*a* of the flange part 28, and the other end of the wire 21*a* (first coil 21) is connected to the first outer electrode 24*a* of the flange part 29. One end of the wire 22*a* (second coil 22) is connected to the second outer electrode 24*b* of the flange part 28, and the other end of the wire 22*a* (second coil 22) is connected to the second outer electrode 24*b* of the flange part 29. One end of the wire 23*a* (third coil 23) is connected to the third outer electrode 24*c* of the flange part 28, and the other end of the wire 23*a* (third coil 23) is connected to the third outer electrode 24*c* of the flange part 29.

The capacitor 25 is provided in adjacent to the core part 27 and the plurality of wires 21*a*, 22*a*, and 23*a* and is provided between the pair of facing flange parts 28 and 29. One end of the capacitor 25 is connected to the third outer electrode 24*c* of the flange part 28, and the other end of the capacitor 25 is connected to the third outer electrode 24*c* of the flange part 29. As described above, the capacitor 25 is provided as a component integrated with the first coil 21, the second coil 22, and the third coil 23 of the common mode choke coil 20. Thus, compared to the case where the capacitor 25 is provided separated from the common mode choke coil 20, the size of the electronic circuit 1 can be reduced.

The configuration of the common mode choke coil 20 and the capacitor 25 illustrated in FIG. 8 is merely an example and may be changed in an appropriate manner. For example, the common mode choke coil 20 may include a plurality of core parts 27, and the three wires 21*a*, 22*a*, and 23*a* may be provided at different core parts. Although the core part 27 is a quadrangular prism, the core part 27 is not limited to this shape. The core part 27 may be a cylinder, a polygonal prism, or the like. Furthermore, arrangement and configuration of the capacitor 25 may be changed in an appropriate manner.

As described above, the electronic circuit 1 according to this embodiment includes the shield line 10, the signal ground 31, the frame ground 32, the common mode choke coil 20, and the capacitor 25. The shield line 10 includes the first signal line 11*a*, the second signal line 11*b*, and the shield 15, the first signal line 11*a* and the second signal line 11*b* being connected to the signal source 41, the shield 15, which can be a coating, positioned around the first signal line 11*a* and the second signal line 11*b*. The signal ground 31 is provided near the signal source 41. The frame ground 32 is isolated from the signal ground 31 and is connected to the shield 15. The common mode choke coil 20 includes the first coil 21, the second coil 22, and the third coil 23 that are magnetically coupled to one another. The capacitor 25 is connected in parallel with the third coil 23. The first coil 21 is connected in series between the signal source 41 and the first signal line 11*a*, the second coil 22 is connected in series between the signal source 41 and the second signal line 11*b*, and the third coil 23 and the capacitor 25 that are connected in parallel are connected between the signal ground 31 and the frame ground 32.

Thus, since the capacitor 25 is provided in parallel with the third coil 23, the electronic circuit 1 exhibits excellent attenuation characteristics in a low frequency band, compared to the case where the capacitor 25 is not provided. Furthermore, by appropriately setting the capacitance value C of the capacitor 25 in accordance with the frequency of common mode noise, the common mode noise can be reduced effectively. Furthermore, the signal ground 31, the LC filter formed by the third coil 23 and the capacitor 25, which are connected in parallel, and the frame ground 32 configure a return path for a signal. Thus, compared to the case where an LC filter is not provided between the signal ground 31 and the frame ground 32, the return path can be shortened. Therefore, generation of common mode noise can be reduced. Accordingly, the size of the electronic circuit 1 can be reduced, and noise in the electronic circuit 1 can be reduced effectively.

Furthermore, in the electronic circuit 1, the capacitor 25 is a capacitor element.

Thus, the capacitance value C of the capacitor 25 can be varied easily in accordance with the frequency of common mode noise.

Furthermore, the first coil 21, the second coil 22, the third coil 23, and the capacitor 25 are integrated into a component in the electronic circuit 1.

Thus, the size of the electronic circuit 1 can be reduced.

Furthermore, in the electronic circuit 1, the common mode choke coil 20 includes the core part 27, the pair of flange parts 28 and 29 that are provided at ends of the core part 27, the first outer electrode 24*a*, the second outer electrode 24*b*, and the third outer electrode 24*c* that are provided at each of the pair of flange parts 28 and 29, and the three wires 21*a*, 22*a*, and 23*a*. The wires 21*a*, 22*a*, and 23*a* are wound around the core part 27 to form the first coil 21, the second coil 22, and third coil 23, respectively. Both ends of the first coil 21 are connected to the first outer electrodes 24*a*, both ends of the second coil 22 are connected to the second outer electrodes 24*b*, and both ends of the third coil 23 are connected to the third outer electrodes 24*c*. The capacitor 25 is provided between the pair of facing flange parts 28 and 29 and is connected to the third outer electrodes 24*c*.

Thus, the common mode choke coil 20 and the capacitor 25 are integrated into a component. Therefore, the size of the electronic circuit 1 can be reduced.

Furthermore, in the electronic circuit 1, the inductance value L of the common mode choke coil 20 and the capacitance value C of the capacitor 25 are represented by $$1.6\times10^{-19}\leq L\times C\leq2.5\times10^{-14} \text{ and}$$

$$C\geq3 \text{ pF.}$$

Thus, the electronic circuit 1 can achieve an excellent noise reduction effect within a range between 1 MHz and 400 MHz, both inclusive, which is required in an immunity test, and can secure a return path for a signal at a frequency of 1 GHz or more.

The embodiments described above are intended to facilitate understanding of the present disclosure and are not intended to be interpreted as limiting the present disclosure. The present disclosure may be modified/improved without departing from the scope of the present disclosure. The present disclosure also encompasses equivalents thereof.

What is claimed is:

1. An electronic circuit comprising:
a shield line that includes a first signal line, a second signal line, and a shield, the first signal line and the second signal line being connected to a signal source, and the shield extending around the first signal line and the second signal line;
a signal ground that is near the signal source;
a frame ground that is isolated from the signal ground and is connected to the shield;
a common mode choke coil that includes a first coil, a second coil, and a third coil magnetically coupled to one another; and
a capacitor that is connected in parallel with the third coil, wherein
the first coil is connected in series between the signal source and the first signal line,
the second coil is connected in series between the signal source and the second signal line, and
the third coil and the capacitor that are connected in parallel are connected between the signal ground and the frame ground.

2. The electronic circuit according to claim 1, wherein the capacitor is a capacitor element.

3. The electronic circuit according to claim 1, wherein the first coil, the second coil, the third coil, and the capacitor are integrated into a component.

4. The electronic circuit according to claim 1, wherein
the common mode choke coil includes a core part, a pair of flange parts that are at ends of the core part, a first outer electrode, a second outer electrode, and a third outer electrode that are at each of the pair of flange parts, and three wires,
the three wires are wound around the core part to configure the first coil, the second coil, and the third coil,
both ends of the first coil are connected to the first outer electrodes, both ends of the second coil are connected to the second outer electrodes, and both ends of the third coil are connected to the third outer electrodes, and
the capacitor is between the pair of facing flange parts and is connected to the third outer electrodes.

5. The electronic circuit according to claim 1, wherein an inductance value of the common mode choke coil and a capacitance value of the capacitor are represented by $$1.6\times10^{-19}\leq L\times C\leq2.5\times10^{-14} \text{ and}$$

$$C\geq3 \text{ pF.}$$

6. The electronic circuit according to claim 2, wherein the first coil, the second coil, the third coil, and the capacitor are integrated into a component.

7. The electronic circuit according to claim 2, wherein the common mode choke coil includes a core part, a pair of flange parts that are at ends of the core part, a first outer electrode, a second outer electrode, and a third outer electrode that are at each of the pair of flange parts, and three wires, the three wires are wound around the core part to configure the first coil, the second coil, and the third coil, both ends of the first coil are connected to the first outer electrodes, both ends of the second coil are connected to the second outer electrodes, and both ends of the third coil are connected to the third outer electrodes, and the capacitor is between the pair of facing flange parts and is connected to the third outer electrodes.

8. The electronic circuit according to claim 3, wherein the common mode choke coil includes a core part, a pair of flange parts that are at ends of the core part, a first outer electrode, a second outer electrode, and a third outer electrode that are at each of the pair of flange parts, and three wires, the three wires are wound around the core part to configure the first coil, the second coil, and the third coil, both ends of the first coil are connected to the first outer electrodes, both ends of the second coil are connected to the second outer electrodes, and both ends of the third coil are connected to the third outer electrodes, and the capacitor is between the pair of facing flange parts and is connected to the third outer electrodes.

9. The electronic circuit according to claim 6, wherein the common mode choke coil includes a core part, a pair of flange parts that are at ends of the core part, a first outer electrode, a second outer electrode, and a third outer electrode that are at each of the pair of flange parts, and three wires, the three wires are wound around the core part to configure the first coil, the second coil, and the third coil, both ends of the first coil are connected to the first outer electrodes, both ends of the second coil are connected to the second outer electrodes, and both ends of the third coil are connected to the third outer electrodes, and the capacitor is between the pair of facing flange parts and is connected to the third outer electrodes.

10. The electronic circuit according to claim 2, wherein an inductance value of the common mode choke coil and a capacitance value of the capacitor are represented by $$1.6\times10^{-19} \leq L\times C \leq 2.5\times10^{-14} \text{ and}$$

$$C \geq 3 \text{ pF.}$$

11. The electronic circuit according to claim 3, wherein an inductance value of the common mode choke coil and a capacitance value of the capacitor are represented by $$1.6\times10^{-19} \leq L\times C \leq 2.5\times10^{-14} \text{ and}$$

$$C \geq 3 \text{ pF.}$$

12. The electronic circuit according to claim 4, wherein an inductance value of the common mode choke coil and a capacitance value of the capacitor are represented by $$1.6\times10^{-19} \leq L\times C \leq 2.5\times10^{-14} \text{ and}$$

$$C \geq 3 \text{ pF.}$$

13. The electronic circuit according to claim 6, wherein an inductance value of the common mode choke coil and a capacitance value of the capacitor are represented by $$1.6\times10^{-19} \leq L\times C \leq 2.5\times10^{-14} \text{ and}$$

$$C \geq 3 \text{ pF.}$$

14. The electronic circuit according to claim 7, wherein an inductance value of the common mode choke coil and a capacitance value of the capacitor are represented by $$1.6\times10^{-19} \leq L\times C \leq 2.5\times10^{-14} \text{ and}$$

$$C \geq 3 \text{ pF.}$$

15. The electronic circuit according to claim 8, wherein an inductance value of the common mode choke coil and a capacitance value of the capacitor are represented by $$1.6\times10^{-19} \leq L\times C \leq 2.5\times10^{-14} \text{ and}$$

$$C \geq 3 \text{ pF.}$$

16. The electronic circuit according to claim 9, wherein an inductance value of the common mode choke coil and a capacitance value of the capacitor are represented by $$1.6\times10^{-19} \leq L\times C \leq 2.5\times10^{-14} \text{ and}$$

$$C \geq 3 \text{ pF.}$$

* * * * *